(12) United States Patent
Griniasty et al.

(10) Patent No.: US 7,712,013 B2
(45) Date of Patent: May 4, 2010

(54) BLOCK DECODING METHODS AND APPARATUS

(75) Inventors: Meir Griniasty, Kfar-Azar (IL); Moti Altahan, Rishon-Le-Zion (IL)

(73) Assignee: Intel Corporation, Santa Clara, CA (US)

( * ) Notice: Subject to any disclaimer, the term of this patent is extended or adjusted under 35 U.S.C. 154(b) by 1308 days.

(21) Appl. No.: 11/084,502

(22) Filed: Mar. 18, 2005

(65) Prior Publication Data
US 2006/0212784 A1    Sep. 21, 2006

(51) Int. Cl.
*H03M 13/03* (2006.01)
(52) U.S. Cl. .................. 714/791; 714/755; 714/758
(58) Field of Classification Search .......... 714/791, 714/755, 758, 784, 800, 768, 795
See application file for complete search history.

(56) References Cited

U.S. PATENT DOCUMENTS

| 5,014,275 | A  | * | 5/1991 | Shimoda et al. ............. 714/791 |
| 5,561,762 | A  | * | 10/1996 | Smith et al. .................... 714/33 |
| 5,577,053 | A  | * | 11/1996 | Dent ........................... 714/755 |
| 6,182,261 | B1 | * | 1/2001 | Haller et al. ................. 714/758 |
| 6,615,385 | B1 | * | 9/2003 | Kim et al. .................... 714/758 |
| 7,180,892 | B1 | * | 2/2007 | Tackin ........................ 370/389 |
| 7,222,286 | B2 | * | 5/2007 | Kim ............................ 714/784 |
| 2005/0149842 | A1 | * | 7/2005 | Kyung et al. ................ 714/800 |

OTHER PUBLICATIONS

Nill, C., et al., "List and soft symbol output Viterbi algorithms: extensions and comparisons", *IEEE Transactions on Communications*, 43(234), (Feb./Mar./Apr. 1995),277-287.

Roder, Martin, et al., "Fast list Viterbi decoding and application for source-channel coding of images", *Konstanzer Schriften in Mathematik and Informatik Nr. 182*, This paper was originally presented at the following conference—Multimedia and Expo, 2002. ICME '02. Proceedings. 2002 IEEE International Conference on , vol. 1,(Dec. 2002, revised preprint Jan. 2003),1-16.

Soong, F K., et al., "A tree-trellis based fast search for finding the N-best sentence hypotheses in continuous speech recognition", *ICASSP-91., 1991 International Conference onAcoustics, Speech, and Signal Processing*, 1, (Apr. 14-17, 1991),705-708.

* cited by examiner

*Primary Examiner*—Scott T Baderman
*Assistant Examiner*—Fritz Alphonse
(74) *Attorney, Agent, or Firm*—Schwegman, Lundberg & Woessner, P.A.

(57) ABSTRACT

In an embodiment, a method includes performing a redundancy check to determine if a baseline bit sequence is compliant. When the baseline bit sequence is not compliant, the method additionally includes performing an iterative process until a compliant, candidate bit sequence is identified. The iterative process includes identifying one or more existing branches within a conceptual tree diagram, calculating scores for potential paths branching from the one or more existing branches, and performing a subsequent redundancy check on a next candidate bit sequence, which corresponds to a potential path that has a next lowest score, to determine if the next candidate bit sequence is compliant.

26 Claims, 5 Drawing Sheets

BLOCK DECODING METHODS AND APPARATUS

TECHNICAL FIELD

Various embodiments described herein relate to communications generally, including apparatus, systems, and methods for decoding information.

BACKGROUND

In a wireless communication system, a source device encodes input data, modulates the encoded data, and transmits a corresponding signal over a channel to a destination device. When a high-quality channel is present between the source device and the destination device, the signal may be received with few or no errors. However, when a low-quality channel is present, a significant quantity of errors may be introduced into the signal prior to its reception by the destination device. Error measurements may be quantified in terms of bit error rates or block error rates.

Some encoding techniques enable a destination device to detect errors in a received signal. For example, some encoding techniques add redundancy bits to the input data, prior to transmission. In order to detect errors, the destination device may evaluate the redundancy bits in light of the other received data. However, encoding techniques that merely add redundancy bits may not enable a decoder to correct the detected errors. Accordingly, when the bit error rate or block error rate is relatively high, communication quality may suffer. These conditions may be present in a noisy or lossy channel.

Other encoding techniques enable a destination device not only to detect errors, but also to correct some or all errors. For example, some encoding techniques use convolutional encoding to encode the input data. When convolutional encoding is applied, a destination device may use a search algorithm (e.g., a Viterbi algorithm) to find the most likely values for the received data. Although convolutional encoding may enable more robust communications, it comes at the expense of decreasing useful data transfer rates. In addition, some search algorithms are computationally costly. Accordingly, efficient data encoding and/or decoding techniques are sought, which enable robust error detection and correction to be performed, while preferably achieving relatively high useful data transfer rates.

DETAILED DESCRIPTION

Various embodiments of the inventive subject matter, described below, include apparatus and methods of decoding information. Embodiments may be implemented in any of a number of different types of communications systems and devices. For example, but not by way of limitation, embodiments may be implemented in systems that include a cellular network (e.g., GSM (Global System for Mobile Communications), AMPS (Advance Mobile Phone System) or D-AMPS (Digital Advance Mobile Phone System)), a local area network (LAN), a wide area network (WAN), a wireless LAN (WLAN), a wireless local loop (WLL), a radio area network (RAN), a personal area network (PAN) (e.g., a Bluetooth network), a satellite network, or any combination thereof, as well as in a variety of devices that communicate with such systems. Embodiments also may be implemented in other systems and devices, which have different configurations, as will be apparent to those of skill in the art, based on the description herein.

An example wireless system configuration is described below in order to illustrate various embodiments. The below example is not meant to limit the scope of the inventive subject matter to embodiments implemented within a wireless system. Instead, as would be apparent to one of skill in the art, based on the description herein, embodiments could be implemented in a number of alternative types of systems.

Figure 1:
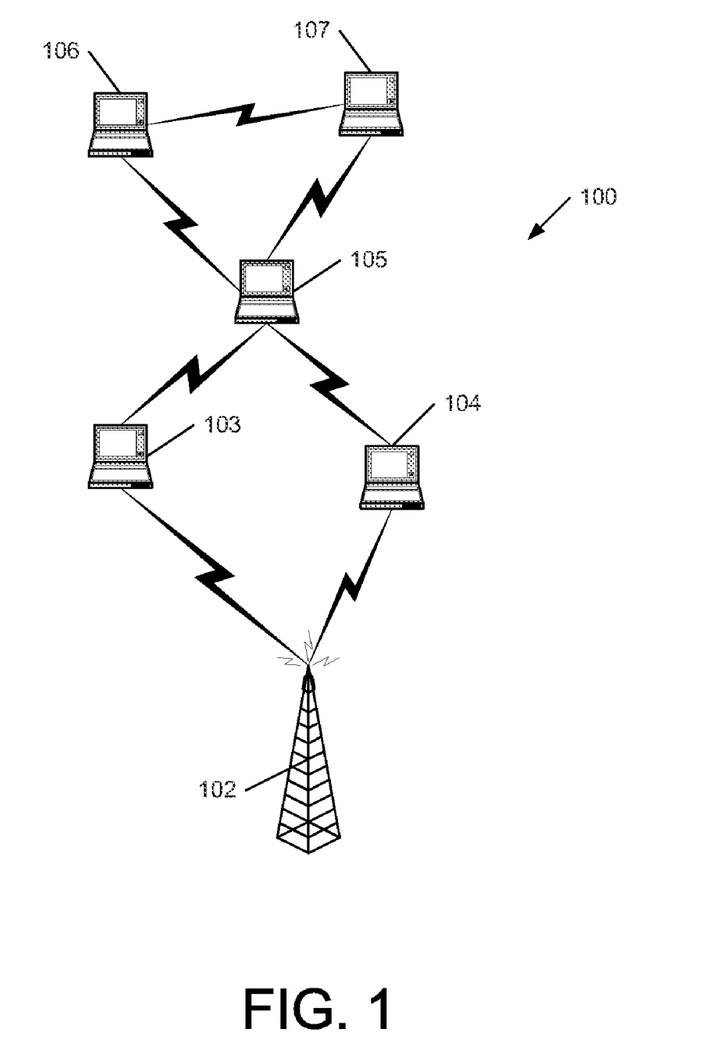
FIG. 1 is a simplified block diagram of a wireless communication system, in accordance with an example embodiment.

FIG. 1 is a simplified block diagram of a wireless communication system 100, in accordance with an example embodiment. A wireless system may include multiple network devices 103, 104, 105, 106, 107 and zero or more access points (APs) 102 (e.g., base stations).

In a wireless system, network devices 103-107 communicate over the medium of free space, commonly referred to as the "air interface." Generally, a device 103-107 may be referred to as a network adapter or network interface card (NIC). A device 103-107 may be mobile, portable or stationary. For example, a device 103-107 may include a computer, a telephone, a radio, or virtually any other one-way or two-way device with the capability of communicating with other devices 103-107 or APs 102 over a wireless medium.

A set of devices 103-107 may communicate directly with each other. Alternatively, or in addition, a set of devices 103, 104 may communicate with one or more APs, such as AP 102. Accordingly, if a first device 103 wants to send a message to a second device 104, the first device 103 may send the message to the AP 102, and the AP 102 may route the message, possibly through one or more other intermediate devices, to the second device 104.

Wireless communications systems are being developed to more efficiently carry data communications. Two such systems are GPRS (General Packet Radio System) and EGPRS (Enhanced GPRS). These systems are packet based data communication systems, which supplement GSM. Although a GPRS system is described below, it is to be understood that embodiments of the inventive subject matter are not limited to use within GPRS or EGPRS systems. Embodiments may be implemented in various other types of systems, which use redundancy bits during the encoding process to enable a destination device to detect errors in a received data block.

A source device within a GPRS data communications system may be capable of dynamically changing between different coding schemes based on current communication conditions. This capability may be referred to as dynamic link adaptation. In order to select a coding scheme, a source device may evaluate information such as carrier strength, interference, signal variance, block error rate, Signal to Noise and Interference Ratio, and bit error rate. Depending on the evaluated information, the source device may select a coding scheme, of those available, for a next sequence of data blocks.

Hence, the encoder may change the effective data transfer rate depending on the current estimated communication conditions (and/or other factors).

A GPRS system may offer four different coding schemes (CS), designated as CS1, CS2, CS3 and CS4. Each coding scheme may provide a different level of error protection to transmitted data and/or a different level of redundancy in transmitted data signals. The level of error protection and/or redundancy affects the useful data transfer rate. Accordingly, each coding scheme also may produce information with a different useful data transfer rate. In particular, CS1, CS2, CS3, and CS4 may provide useful data transfer rates of approximately 9.05, 13.4, 15.6, and 21.4 kbits/sec, respectively.

Some coding schemes, such as CS4, may add redundancy bits, such as cyclic redundancy check (CRC) bits, to the transmitted data. CS4 is a relatively high rate coding scheme, which adds a relatively small number of redundancy bits. By evaluating the redundancy bits, a destination device may detect errors in the received signal. However, the redundancy bit information is not usually used by the destination device to correct the detected errors. Other coding schemes, such as CS1, CS2, and CS3, may add redundancy bits and also apply convolutional encoding to the transmitted data. A corresponding convolutional decoding technique may be used by the destination device to perform error correcting techniques to erroneously-received data. Although convolutional encoding and decoding are useful tools, the additional convolutional encoding information results in a reduction in the useful data transfer rate. Further, convolutional decoding may be a computationally complex process. Embodiments of the subject matter, described herein, enable errors to be detected and corrected using redundancy bits. Embodiments have been shown to provide approximately 1 decibel gains in performance, although higher or lower gains may be achieved, as well.

For very high quality channels, the risk of data corruption may be relatively low. Accordingly, it may be advantageous for a source device to select a coding scheme, such as CS4, which provides a higher useful data transfer rate at the cost of a decreased ability to detect errors and no inherent mechanism to correct errors. Conversely, for a very low quality channel, the risk of data corruption may be relatively high. Accordingly, it may be advantageous for a source device to select a coding scheme, such as CS1, which provides a lower useful data transfer rate but an increased ability to detect and correct errors. The result of enabling a source device to select from different coding schemes is to enable a system to support higher useful data rates when communication conditions are favorable, and to provide enhanced error detection and/or correction mechanisms when communication conditions are adverse.

Figure 2:
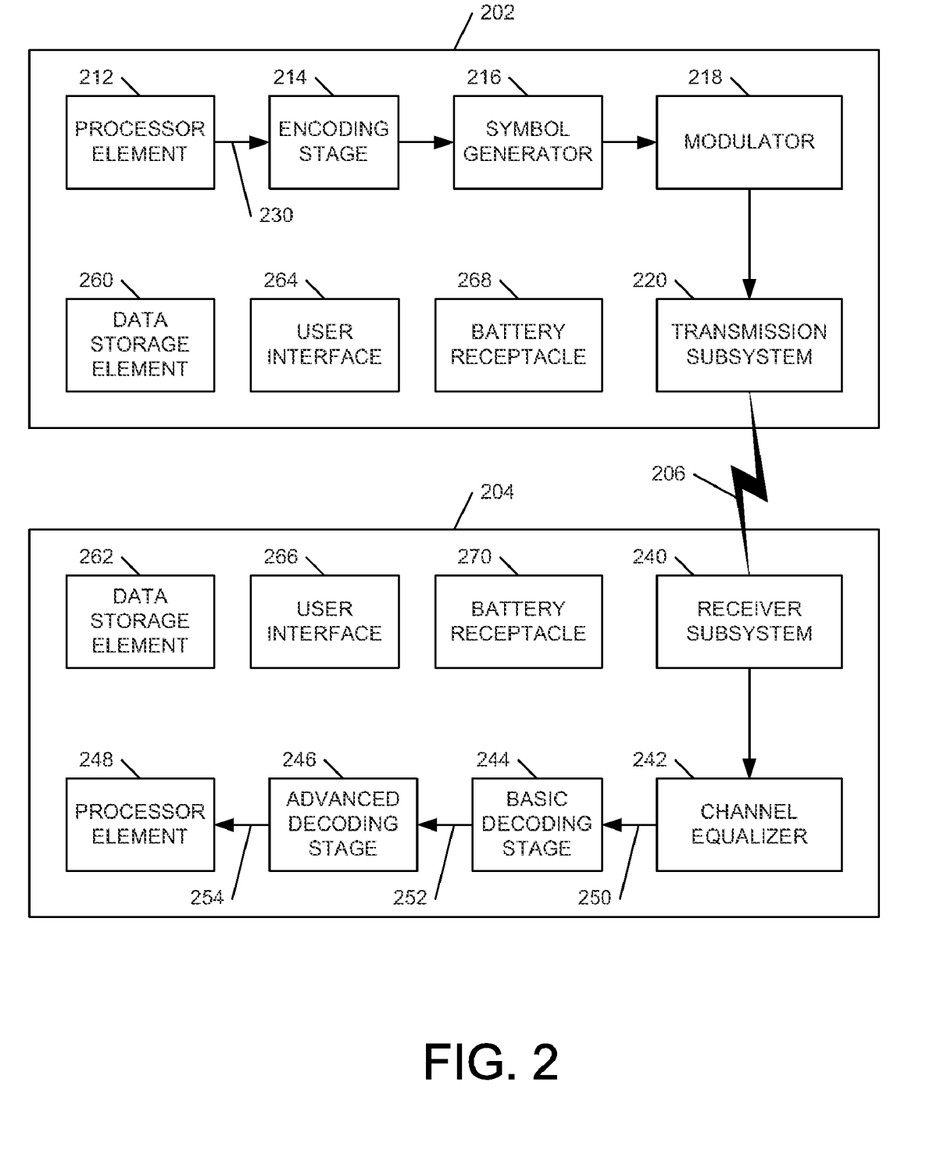
FIG. 2 is a simplified block diagram of a source device and a destination device, which communicate over a channel, in accordance with an example embodiment.

FIG. 2 is a simplified block diagram of a source device 202 and a destination device 204, which communicate over a channel 206, in accordance with an example embodiment. Devices 202, 204 may be mobile, portable or stationary, and may communicate over wireless links or wired connections.

For example, but not by way of limitation, either or both devices 202, 204 may include a laptop, desktop or larger computer, a cellular telephone, a radio, a pager, a personal data assistant, a PAN-compatible device, a wireless computer peripheral (e.g., a keyboard, headset, pointing device), a global positioning system (GPS) device, an intermediate communications device (e.g., a router, base station, access point, satellite, etc.), a consumer electronics device (e.g., a television, game system, game system peripheral, etc.) or any other electronic device with the capability of communicating over a wireless link. In other embodiments, devices 202, 204 may include devices that communicate over wired links to a network or other electronic device, such as, for example, various wired counterparts to the devices listed in the previous sentence.

Source device 202 includes at least one processor element 212, an encoding stage 214, a symbol generator 216, a modulator 218, and a transmission subsystem 220, in an embodiment. Processor element 212 may include one or more general-purpose or special-purpose processors, application specific integrated circuits (ASICs), other discrete or integrated circuits, or combinations thereof. Processor element 212 may perform any of a number of functions, including but not limited to, data processing (e.g., creating, consuming, or otherwise processing data), communications control functions, and device control functions, among other things. In a particular embodiment, processor 212 produces input data bits 230.

Input data bits 230 are input to encoding stage 214. In an embodiment, encoding stage 214 may include an encoder that is adapted to add redundancy bits and/or to perform convolutional encoding to the input data bits 230. The terms "block encoded data" and "block encoded information" are used herein to mean encoded data or information, respectively, which includes redundancy bits as a portion of the encoded sequence. The terms "convolutionally encoded data" and "convolutionally encoded information" are used herein to mean data or information, respectively, which have been convolutionally encoded. Convolutionally encoded data or information may or may not include redundancy bits.

In a particular embodiment, encoding stage 214 may select from a set of available coding schemes (e.g., coding schemes available in a GPRS or EGPRS system), each of which may add a different level of error correction and/or error detection information to the input data bits 230. In an embodiment, encoding stage 214 adds redundancy bits to the input data bits to enable errors in transmission to be identified by destination device 204. For example, in an embodiment, encoding stage 214 adds CRC bits to the input data bits. Other types of redundancy bits may be added, in other embodiments. Encoding stage 214 may also perform convolutional encoding.

The bits output from encoding stage 214 are mapped to symbols by symbol generator 216, in an embodiment. In other words, symbol generator 216 is adapted to transform the bits to modulator symbols. The modulator symbols are input to modulator 218, which is adapted to generate an analog signal from the modulator symbols. The analog signal may be subsequently transmitted, via transmission subsystem 220, over channel 206.

In an embodiment, transmission subsystem 220 includes one or more antennas (e.g., a dipole, patch, omni-directional or other type of antenna), which enables communications over a wireless channel 206 (e.g., over an air interface). In another embodiment, in which an infrared specification is implemented, one or more light-emitting diodes (LEDs) (not shown) or other optical transmission devices may be used in lieu of an antenna. In still other alternate embodiments, devices 202, 204 may communicate over wired channels or networks (not illustrated), and accordingly, transmission subsystem 220 may include a network interface or other wired channel interface. Channel 206 may include, for example, a mobile wireless channel (e.g., cellular or cordless), a fixed wireless channel (e.g., satellite), or a wired channel (e.g., xDSL, ISDN, Ethernet, etc.).

Destination device 204 includes a receiver subsystem 240, a channel equalizer 242, a basic decoding stage 244, an advanced decoding stage 246, and a processor element 248, in an embodiment. At the destination device 204, an analog signal from channel 206 is received by receiver subsystem 240. In an embodiment, receiver subsystem 240 includes one or more antennas. In an embodiment that implements an infrared specification, one or more optical receivers may be used in lieu of an antenna. In still other embodiments, receiver subsystem 240 may include a network interface or other wired channel interface.

The received signal is input to channel equalizer 242. Channel equalizer 242 is adapted to attempt to detect the symbols that were originally transmitted by source device 202. In an embodiment, symbol detection is achieved by demodulating and sampling the received signal to generate soft values or soft metrics 250. In an embodiment, soft values 250 include a sequence of log likelihood ratios (LLRs), which are input to basic decoding stage 244. Other types of soft values may be used, in other embodiments.

In an embodiment, basic decoding stage 244 produces sequences of decision bits 252 (e.g., hard bits) from samples 250. In an embodiment, advanced decoding stage 246 is adapted to identify erroneous bit sequences using their corresponding redundancy bits. Advanced decoding stage 246 also is adapted to determine alternative candidate sequences, using a tree search algorithm, and to check the alternative candidate sequences against the redundancy bits, until a compliant candidate sequence is identified, in an embodiment. Advanced decoding stage 246 generates a decoded frame, or decoded information bits 254, which represent the compliant candidate sequence. The decoded frame 254 may be consumed, stored, or transferred by processor element 248.

Devices 202, 204 further may include one or more data storage elements 260, 262. Data storage elements 260, 262 may include, for example, one or more volatile or non-volatile storage media, including read only memory (ROM), random access memory (RAM), hard disk, removable storage media (e.g., CD ROM, digital video disk, floppy disk), magnetic cassettes, memory cards or sticks, other storage media, or combinations thereof. Data storage elements 260, 262 may permanently or temporarily store, for example, data and computer-executable instructions, among other things.

In an embodiment, devices 202, 204 also may include one or more user interfaces 264, 266. For example, but not by way of limitation, a user interface 264, 266 may include a keyboard, keypad, pointing or selection device, speaker, microphone, display device, or combinations thereof. Further, devices 202, 204 also may include one or more battery receptacles 268, 270. Accordingly, with properly-charged batteries installed, devices 202, 204 may operate without access to a continuous source of power (e.g., in the case of a portable electronic device), or may operate when an interruption occurs to a continuous source of power. In various alternate embodiments, devices 202, 204 may include additional or different elements than those illustrated in FIG. 2, and/or the elements may be differently arranged.

An embodiment of a decoder method may be briefly described as follows. For an input sequence of soft values (e.g., LLRs), decoding includes determining a baseline bit sequence (e.g., a hard bit sequence) corresponding to the soft values, and performing a redundancy check to determine if the baseline bit sequence is compliant. If the baseline bit sequence is not compliant, an embodiment of the method may further include performing an iterative search process until a compliant, candidate bit sequence is identified. The iterative search process may include determining a next candidate bit sequence using a tree search algorithm (e.g., a variant of a Viterbi algorithm), where the next candidate has a next lowest accumulated difference from the baseline bit sequence, and performing a redundancy check on the next candidate. Ultimately, when a compliant bit sequence is determined, it may be delivered as decoded information bits to a data recipient.

Figure 3:
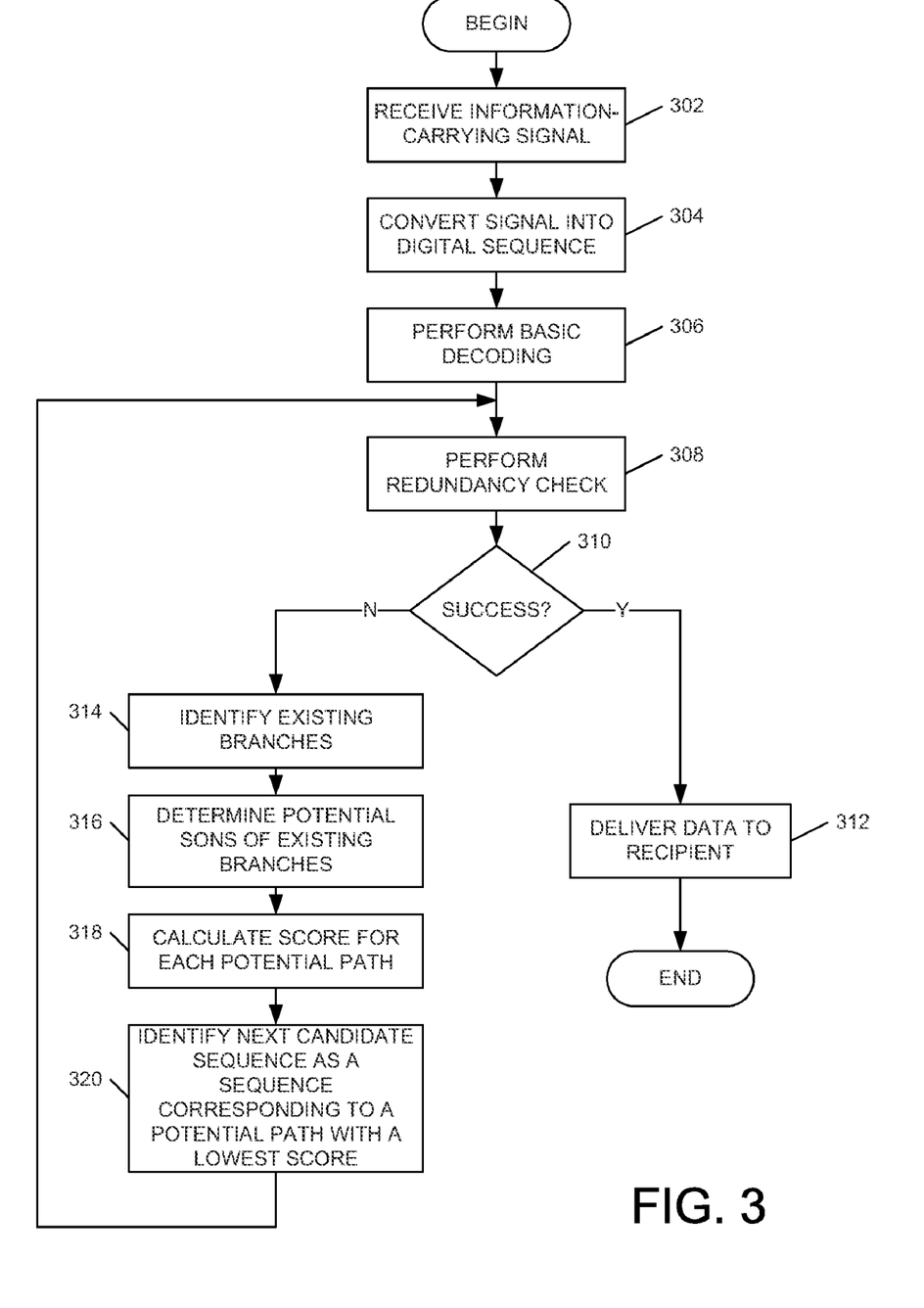
FIG. 3 is a flowchart of a method for decoding, in accordance with an example embodiment.

FIG. 3 is a flowchart of a method for decoding, in accordance with an example embodiment. Embodiments of the method may be performed within a destination device, and more particularly, within a decoder of a destination device.

The method begins, in block 302, when an information-carrying signal is received by a destination device. In an embodiment, the information-carrying signal is an analog signal carried on a wireless channel according to a wireless protocol. The information-carrying signal may be an analog signal using a CS4 logical channel, as defined in GPRS. Accordingly, in this embodiment, the information-carrying signal may carry block encoded information, which is not convolutionally encoded. In an alternate embodiment, the information-carrying signal may be convolutionally encoded, for example, as is the case for signals carried on CS1, CS2, and CS3 logical channels.

In block 304, a portion of the information-carrying signal is sampled, digitized and converted into a digital sequence, which may include signed or unsigned soft values or soft metrics. For example, but not by way of limitation, the digital sequence may include a sequence of signed, log likelihood ratio (LLR) values (i.e., an LLR may be defined as log(prob(bit=1)/prob(bit=0))). Although LLR values are used in the description, below, one of skill in the art would understand, based on the description herein, that other soft value representations may be used, in alternate embodiments.

In an embodiment, the sequence of LLRs may correspond to the data within a data block, which includes a number, N-n, of data values and a number, n, of redundancy bit values. In an embodiment, redundancy bits are CRC bits. However, one of skill in the art would understand, based on the description herein, that other types of redundancy bits may be used, in other embodiments.

Adding the number of data values (N-n) and the number of redundancy bit values (n) yields a data block that includes N values. For example, in GPRS, the CS4 logical channel may carry data blocks having 431 data values and 16 CRC values, yielding a data block size of N=447 bits. In other embodiments, more or fewer data values and/or redundancy bit values may form a data block.

In the description below, a sequence of ten example LLR data values is given, for purposes of explanation only, to represent data values for a received data block. It would be apparent to one of skill in the art, based on the description herein, that a data block may have significantly more data values (or fewer). More specifically, the following sequence of ten data values is given as an example of LLR data values that could, hypothetically, be produced from a digitized, input signal.

LLR sequence:

| −10 | 8 | 6 | −7 | 5 | 9 | 11 | 1 | 8 | 2 |
|---|---|---|---|---|---|---|---|---|---|
| LLR1 | LLR2 | LLR3 | LLR4 | LLR5 | LLR6 | LLR7 | LLR8 | LLR9 | LLR10. |

Referring again to FIG. 3, in block 306, basic decoding is performed on the data values, which includes determining a "baseline sequence" of bit values from the sequence of soft values. In an embodiment, each bit in the baseline sequence is set to one, if the sign of the corresponding LLR is positive, and is set to zero, if the sign of the corresponding LLR is negative. Using this criteria and the example sequence of LLR data values given above, a basic decoding process would yield a hypothetical baseline sequence of bit values as follows:

Baseline sequence:

| 0 | 1 | 1 | 0 | 1 | 1 | 1 | 1 | 1 | 1 |
|---|---|---|---|---|---|---|---|---|---|
| bit 1 | bit 2 | bit 3 | bit 4 | bit 5 | bit 6 | bit 7 | bit 8 | bit 9 | bit 10. |

The bit values produced during basic decoding, also referred to herein as a "first candidate sequence" or a "baseline sequence," may or may not correspond to the actual sequence of data bits that was encoded and transmitted. For example, assume that the actual sequence of data bits that was encoded and transmitted was as follows:

Correct sequence:

| 0 | 1 | 1 | 0 | 0 | 1 | 1 | 0 | 1 | 1 |
|---|---|---|---|---|---|---|---|---|---|
| bit 1 | bit 2 | bit 3 | bit 4 | bit 5 | bit 6 | bit 7 | bit 8 | bit 9 | bit 10. |

A comparison between the baseline sequence and the correct sequence shows that bit 5 and bit 8 were improperly decoded during the basic decoding process. In an embodiment, an incorrect result of basic decoding may be detected, in most cases, by performing a redundancy check, in block 308. In a particular embodiment, the redundancy check includes a CRC. A CRC may be performed by correlating the baseline sequence, which was determined during the basic decoding process (block 306), with the CRC values received for the data block.

In block 310, a determination is made whether the redundancy check was successful. If so, then the decoded sequence of bit values is considered a "compliant sequence," and the corresponding decoded frame may be delivered to a data recipient, in block 312. The method then ends. In an embodiment, the data recipient may be a processor element (e.g., processor element 248, FIG. 2) within a device. In an alternate embodiment, the data recipient may be another element of the device, or may form a portion of a separate device.

Referring again to block 310, if the redundancy check is not successful, then a next candidate sequence is determined, in blocks 314-320, and checked, in blocks 308, 310. The procedure iterates, as shown, until a compliant sequence is identified, in an embodiment, at which time the decoded frame is delivered to the data recipient, in block 312. In an alternate embodiment, the procedure may allow a finite number of iterations before declaring a decoding failure.

Figure 4:
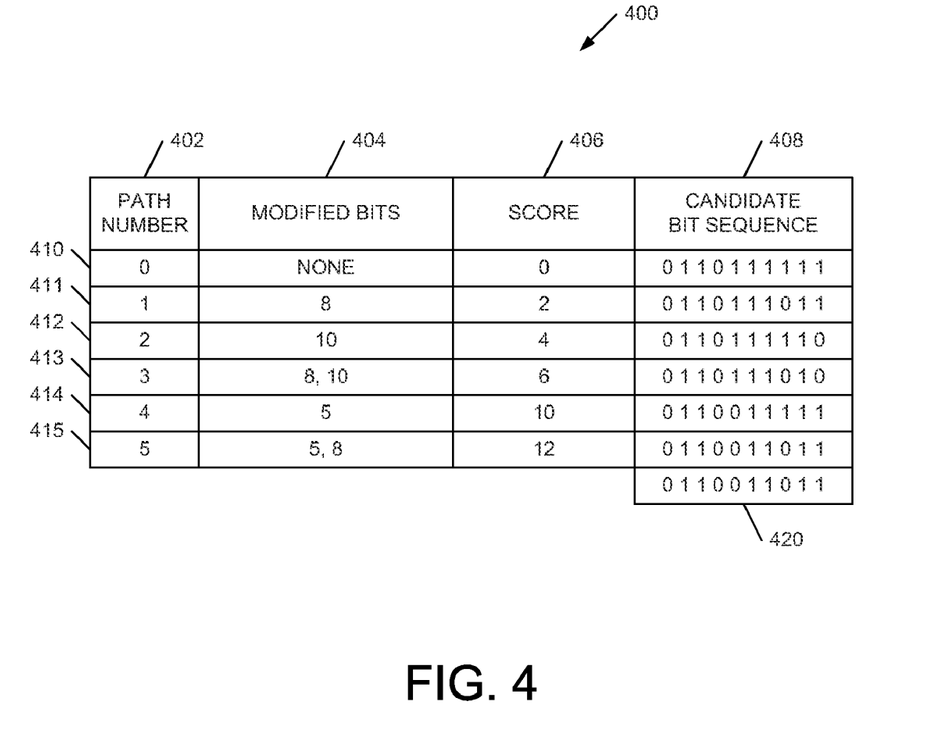
FIG. 4 is a table illustrating data associated with a hypothetical search, in accordance with an example embodiment.
Figure 5:
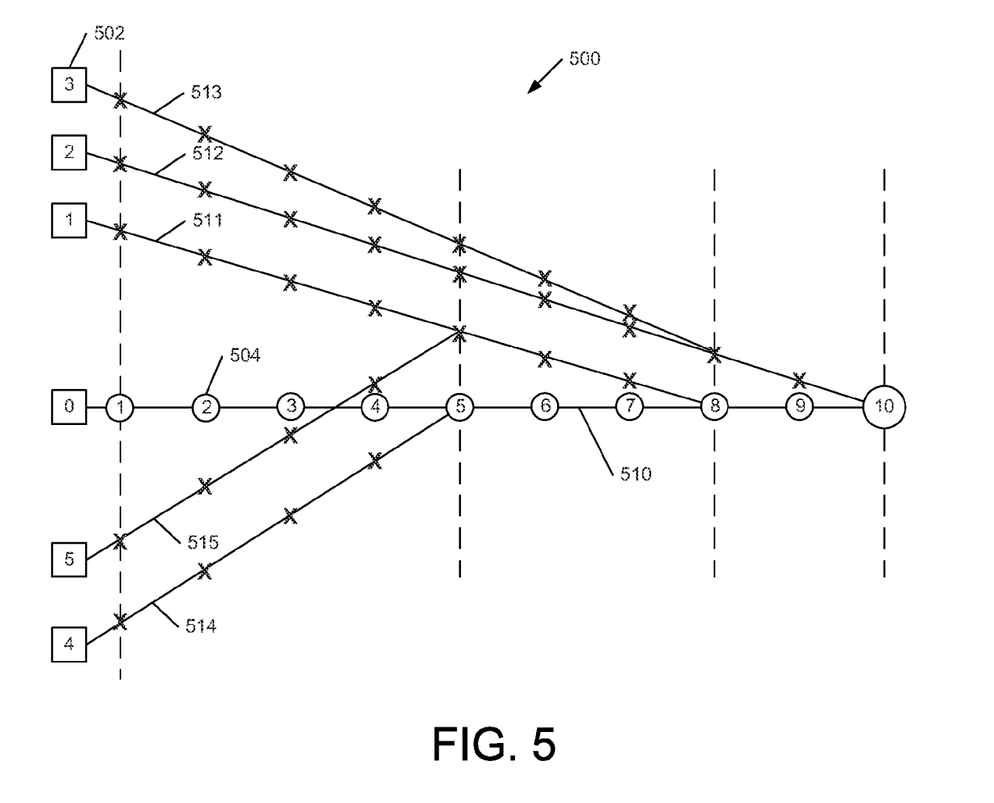
FIG. 5 is a conceptual diagram illustrating various paths associated with a hypothetical search, in accordance with an example embodiment.

A method for determining a next candidate sequence is illustrated in blocks 314-320. The method may be performed one or more times in order to identify a compliant sequence. In an embodiment, determining candidate sequences and, ultimately, identifying a compliant sequence is performed using a tree search algorithm. Understanding the tree search algorithm and the various embodiments will be facilitated by referring to FIGS. 4 and 5, along with FIG. 3. FIGS. 4 and 5 are briefly explained, and then referred to repeatedly below, along with FIG. 3, to illustrate the iterative nature of various embodiments.

FIG. 4 is a table 400 illustrating various parameters associated with a hypothetical tree search, in accordance with an example embodiment. Table 400 may include multiple records 410-415, where each record corresponds to a candidate sequence, and each record has multiple fields. In an embodiment, these fields include a path number field 402, a modified bits field 404, a score field 406, and a candidate bit sequence field 408.

The first record 410 corresponds to a baseline bit sequence, in an embodiment. The baseline bit sequence is identified as corresponding to "Path 0," where a "path" is a portion of a tree search diagram that includes portions of one or more "branches," explained in more detail below. The path number increments for each new candidate sequence.

Each new candidate sequence is a modified version of the baseline sequence or another candidate sequence that preceded it. The term "modified" means that one or more bits in the new sequence are different from bits in a previous sequence. In an embodiment, modified bits field 404 indicates which bits, for the candidate sequence, have been modified with respect to the baseline sequence. Because record 410 corresponds to a baseline sequence, the modified bits may be identified as "none."

The score field 406 includes a value, for each candidate sequence, which indicates a magnitude of a deviation of the candidate sequence from the baseline sequence. Accordingly, the score for the baseline sequence may be set to "0." Calculation of a score for a candidate sequence will be described in more detail later.

Finally, the candidate bit sequence field 408 includes the values within the candidate bit sequence. For example, for the baseline bit sequence represented in record 410, the candidate bit sequence field 408 includes the baseline bit sequence. Using the example given above, the baseline bit sequence is:

Baseline sequence:

| 0 | 1 | 1 | 0 | 1 | 1 | 1 | 1 | 1 | 1 |
|---|---|---|---|---|---|---|---|---|---|
| bit 1 | bit 2 | bit 3 | bit 4 | bit 5 | bit 6 | bit 7 | bit 8 | bit 9 | bit 10. |

For ease of comparison, FIG. 4 also indicates an actual transmitted bit sequence 420, shown under the candidate bit sequence field 408 of the last record 415.

FIG. 5 is a conceptual diagram 500 illustrating various paths associated with a hypothetical tree search, in accordance with an example embodiment. Each path includes portions of one or more lines, or branches 510-515. Path numbers 0-5 are indicated on the left side of FIG. 5 in boxes 502. Path 0 corresponds to "baseline branch" 510, which further corresponds to the baseline bit sequence. Bit numbers 1-10 are indicated along baseline branch 510 in circles 504, referred to herein as "nodes." Nodes along other branches (e.g., branches 511-515) are indicated with "x". As will be explained in more detail below, a new branch may originate from an existing branch at any unused node along the existing branches.

Referring back to FIG. 3, identification of a next candidate sequence begins in block 314, in which currently existing branches are identified in a conceptual tree search diagram. During a first iteration of block 314, only the baseline sequence exists, and accordingly only one branch exists. The existing branch is represented in FIG. 5 as branch 510.

In block 316, potential "sons" of the existing branch are determined. A "son" is a term used herein to mean a potential new branch that splits off from an existing branch at one of the available nodes (e.g., node 504, FIG. 5) along the existing branch. Referring to FIG. 5, existing branch 510 includes ten nodes, and accordingly ten potential sons may be identified. Each potential son forms a portion of a new, potential path.

In block 318, an accumulated score may be calculated for each potential path. In an embodiment, an accumulated score is calculated based on the magnitude of the LLRs corresponding to the nodes from which potential sons may split, plus the magnitudes corresponding to any earlier splits in the potential path. In a particular embodiment, a score for a potential son equals twice the magnitudes of the LLRs corresponding to split points in the potential path, although this calculation may be different, in other embodiments. During the first iteration of blocks 314-320, only one split point exists for each potential path, since all potential sons branch from the baseline branch (i.e., branch 510, FIG. 5). Referring again to the previous example, ten example LLR values were given as:

LLR sequence:

| −10 | 8 | 6 | −7 | 5 | 9 | 11 | 1 | 8 | 2 |
|---|---|---|---|---|---|---|---|---|---|
| LLR1 | LLR2 | LLR3 | LLR4 | LLR5 | LLR6 | LLR7 | LLR8 | LLR9 | LLR10. |

Because a potential son exists for each node along the baseline branch 510, ten scores for the ten potential sons may be calculated as follows:

Potential son scores for baseline branch 510:

| 20 | 16 | 12 | 14 | 10 | 18 | 22 | 2 | 16 | 4 |
|---|---|---|---|---|---|---|---|---|---|
| node1 | node2 | node3 | node4 | node5 | node6 | node7 | node8 | node9 | node10. |

In block 320, the next candidate sequence is identified as a sequence corresponding to a potential son with a lowest accumulated score. In the above example, the lowest accumulated score is 2, which corresponds to node 8. The next candidate sequence is calculated by flipping the bit, within the baseline sequence, which is associated with the lowest accumulated score, or in this case, flipping bit 8 of the baseline sequence. Flipping bit 8 of the baseline sequence yields:

Next candidate sequence:

| 0 | 1 | 1 | 0 | 1 | 1 | 1 | 0 | 1 | 1 |
|---|---|---|---|---|---|---|---|---|---|
| bit 1 | bit 2 | bit 3 | bit 4 | bit 5 | bit 6 | bit 7 | bit 8 | bit 9 | bit10. |

The second candidate sequence given above is represented in entry 411 of Table 400 (FIG. 4). The path number (field 402) is identified as path 1, the modified bit (field 404) is indicated as bit 8, the score (field 406) is indicated as 2, and the candidate bit sequence (field 408) is listed as the sequence given above. The second candidate sequence also may be represented in the conceptual tree diagram of FIG. 5. Path 1 includes a portion of branch 510 to the right of node 8, and also includes the entirety of branch 511, which splits from branch 510 at node 8. In an embodiment, a new branch splits to the left from an existing branch.

Referring back to FIG. 3, once the next candidate sequence is determined, then the method iterates as shown, by again performing a redundancy check, in block 308, and determining whether the check was successful, in block 310. For purposes of complete explanation, four more iterations will be briefly described, with reference to FIGS. 4 and 5.

Assuming that the redundancy check was not successful (as determined in block 310), then existing branches are again identified, in block 314. For the second iteration of blocks 314-320, two existing branches may be identified. The two existing branches correspond to branches 510 and 511 of FIG. 5, which further correspond to entries 410 and 411 of FIG. 4.

In block 316, potential sons of the existing branches are determined. Referring to FIG. 5, existing branch 510 includes ten nodes. Excluding the node corresponding to bit 8 (since it has already been used), nine potential sons may be identified for branch 510. Existing branch 511 includes seven nodes. Because none have already been used, seven potential sons may be identified for branch 511.

In block 318, an accumulated score may be calculated for each potential path. As described earlier, in an embodiment, an accumulated score is calculated based on twice the magnitude of the LLRs corresponding to the nodes from which potential sons may split, plus the magnitudes corresponding to any earlier splits in the potential path. Using the ten example LLR values given previously, accumulated scores for potential sons branching from branch 510 may be calculated as follows:

Potential son scores for baseline branch 510:

| 20 | 16 | 12 | 14 | 10 | 18 | 22 | x | 16 | 4 |
|---|---|---|---|---|---|---|---|---|---|
| node1 | node2 | node3 | node4 | node5 | node6 | node7 | node8 | node9 | node10. |

The "x" indicates that a potential son does not exist for a node. A potential son may not exist for a node either because an existing branch already exists there, or because the node is to the right of the existing branch being evaluated.

Next, accumulated scores for potential sons branching from branch 511 may be calculated. Branch 511 had a previous score of 2, which is added to each potential son score, in order to produce the accumulated scores, as follows:

Accumulated potential son scores for branch 511 (previous score of 2 added):

| 22 | 18 | 14 | 16 | 12 | 20 | 24 | x | x | x |
|---|---|---|---|---|---|---|---|---|---|
| node1 | node2 | node3 | node4 | node5 | node6 | node7 | node8 | node9 | node10. |

In block 320, the next candidate sequence is identified as a sequence corresponding to a potential son with a lowest accumulated score. In the above example, the lowest accumulated score for either baseline branch 510 or branch 511 is 4, which corresponds to node 10 of branch 510. The next candidate sequence is calculated by flipping the bit, within the sequence corresponding to branch 510, which is associated with the lowest accumulated score, or in this case, flipping bit 10 of the baseline sequence. Flipping bit 10 of the baseline sequence yields:

Next candidate sequence:

| 0 | 1 | 1 | 0 | 1 | 1 | 1 | 1 | 1 | 0 |
|---|---|---|---|---|---|---|---|---|---|
| bit 1 | bit 2 | bit 3 | bit 4 | bit 5 | bit 6 | bit 7 | bit 8 | bit 9 | bit10. |

The next candidate sequence given above is represented in entry 412 of Table 400 (FIG. 4). The path number (field 402) is identified as path 2, the modified bits (field 404) is indicated as bit 10, the score (field 406) is indicated as 4, and the candidate bit sequence (field 408) is listed as the sequence given above. The next candidate sequence also may be represented in the conceptual tree diagram of FIG. 5. Path 2 includes the entirety of branch 512, which splits from branch 510 at node 10.

Referring back to FIG. 3, once the next candidate sequence is determined, then the method iterates as shown, by again performing a redundancy check, in block 308, and determining whether the check was successful, in block 310. Assuming the redundancy check was not successful, the method iterates again. Three more iterations will be described.

In block 314, existing branches are again identified. For the third iteration of blocks 314-320, three existing branches may be identified. The three existing branches correspond to branches 510-512 of FIG. 5, which further correspond to entries 410-412 of FIG. 4.

In block 316, potential sons of the existing branches are determined. Referring to FIG. 5, existing branch 510 includes ten nodes. Excluding the nodes corresponding to bits 8 and 10 (since they have already been used), eight potential sons may be identified for branch 510. Existing branch 511 includes seven nodes. Because none have already been used, seven potential sons may be identified for branch 511. Existing branch 512 includes nine nodes. Because none have already been used, nine potential sons may be identified for branch 512.

In block 318, an accumulated score may be calculated for each potential path. According to earlier described embodiments, and the ten example LLR values given previously, accumulated scores for potential sons branching from branches 510-512 may be calculated as follows:

Potential son scores for baseline branch 510:

| 20 | 16 | 12 | 14 | 10 | 18 | 22 | x | 16 | x |
|---|---|---|---|---|---|---|---|---|---|
| node1 | node2 | node3 | node4 | node5 | node6 | node7 | node8 | node9 | node10. |

Accumulated potential son scores for branch 511 (previous score of 2 added):

| 22 | 18 | 14 | 16 | 12 | 20 | 24 | x | x | x |
|---|---|---|---|---|---|---|---|---|---|
| node1 | node2 | node3 | node4 | node5 | node6 | node7 | node8 | node9 | node10. |

Accumulated potential son scores for branch 512 (previous score of 4 added):

| 24 | 20 | 16 | 18 | 14 | 22 | 26 | 6 | 20 | x |
|---|---|---|---|---|---|---|---|---|---|
| node1 | node2 | node3 | node4 | node5 | node6 | node7 | node8 | node9 | node10. |

In block 320, the next candidate sequence is identified as a sequence corresponding to a potential son with a lowest accumulated score. In the above example, the lowest accumulated score for branches 510-512 is 6, which corresponds to node 8 of branch 512. The next candidate sequence is calculated by flipping the bit, within the sequence corresponding to branch 512, which is associated with the lowest accumulated score, or in this case, flipping bit 8 of the sequence corresponding to path 2, which yields:

Next candidate sequence:

| 0 | 1 | 1 | 0 | 1 | 1 | 1 | 0 | 1 | 0 |
|---|---|---|---|---|---|---|---|---|---|
| bit 1 | bit 2 | bit 3 | bit 4 | bit 5 | bit 6 | bit 7 | bit 8 | bit 9 | bit 10 |

The next candidate sequence given above is represented in entry 413 of Table 400 (FIG. 4). The path number (field 402) is identified as path 3, the modified bits (field 404) are indicated as bits 8 and 10, the score (field 406) is indicated as 6, and the candidate bit sequence (field 408) is listed as the sequence given above. The next candidate sequence also may be represented in the conceptual tree diagram of FIG. 5. Path 3 includes a portion of branch 512, which occurs to the right of node 8, and the entirety of branch 513, which splits from branch 512 at node 8.

Referring back to FIG. 3, once the next candidate sequence is determined, then the method iterates as shown, by again performing a redundancy check, in block 308, and determining whether the check was successful, in block 310. Assuming the redundancy check was not successful, the method iterates again. Two more iterations will be described.

In block 314, existing branches are again identified. For the fourth iteration of blocks 314-320, four existing branches may be identified. The four existing branches correspond to branches 510-513 of FIG. 5, which further correspond to entries 410-413 of FIG. 4.

In block 316, potential sons of the existing branches are determined. Referring to FIG. 5, existing branch 510 includes ten nodes. Excluding the nodes corresponding to bits 8 and 10 (since they have already been used), eight potential sons may be identified for branch 510. Existing branch 511 includes seven nodes. Because none have already been used, seven potential sons may be identified for branch 511. Existing branch 512 includes nine nodes. Excluding the node corresponding to bit 8, eight potential sons may be identified for branch 512. Existing branch 513 includes seven nodes. Because none have already been used, seven potential sons may be identified for branch 513.

In block 318, an accumulated score may be calculated for each potential path. According to earlier described embodiments, and the ten example LLR values given previously, accumulated scores for potential sons branching from branches 510-513 may be calculated as follows:

Potential son scores for baseline branch 510:

| 20 | 16 | 12 | 14 | 10 | 18 | 22 | x | 16 | x |
|---|---|---|---|---|---|---|---|---|---|
| node1 | node2 | node3 | node4 | node5 | node6 | node7 | node8 | node9 | node10 |

Accumulated potential son scores for branch 511 (previous score of 2 added):

| 22 | 18 | 14 | 16 | 12 | 20 | 24 | x | x | x |
|---|---|---|---|---|---|---|---|---|---|
| node1 | node2 | node3 | node4 | node5 | node6 | node7 | node8 | node9 | node10 |

Accumulated potential son scores for branch 512 (previous score of 4 added):

| 24 | 20 | 16 | 18 | 14 | 22 | 26 | x | 20 | x |
|---|---|---|---|---|---|---|---|---|---|
| node1 | node2 | node3 | node4 | node5 | node6 | node7 | node8 | node9 | node10 |

Accumulated potential son scores for branch 513 (previous score of 6 added):

| 26 | 22 | 18 | 20 | 16 | 24 | 28 | x | x | x |
|---|---|---|---|---|---|---|---|---|---|
| node1 | node2 | node3 | node4 | node5 | node6 | node7 | node8 | node9 | node10 |

In block 320, the next candidate sequence is identified as a sequence corresponding to a potential son with a lowest accumulated score. In the above example, the lowest accumulated score for branches 510-513 is 10, which corresponds to node 5 of branch 510. The next candidate sequence is calculated by flipping the bit, within the sequence corresponding to branch 510, which is associated with the lowest accumulated score, or in this case, flipping bit 5 of the sequence corresponding to path 0, which yields:

Next candidate sequence:

| 0 | 1 | 1 | 0 | 0 | 1 | 1 | 1 | 1 | 1 |
|---|---|---|---|---|---|---|---|---|---|
| bit 1 | bit 2 | bit 3 | bit 4 | bit 5 | bit 6 | bit 7 | bit 8 | bit 9 | bit 10 |

The next candidate sequence given above is represented in entry 414 of Table 400 (FIG. 4). The path number (field 402) is identified as path 4, the modified bits (field 404) is indicated as bit 5, the score (field 406) is indicated as 10, and the candidate bit sequence (field 408) is listed as the sequence given above. The next candidate sequence also may be represented in the conceptual tree diagram of FIG. 5. Path 4 includes a portion of branch 510, which occurs to the right of node 5, and the entirety of branch 514, which splits from branch 510 at node 5.

Referring back to FIG. 3, once the next candidate sequence is determined, then the method iterates as shown, by again performing a redundancy check, in block 308, and determining whether the check was successful, in block 310. Assuming the redundancy check was not successful, the method iterates again. One more iteration will be described.

In block 314, existing branches are again identified. For the fifth iteration of blocks 314-320, five existing branches may be identified. The five existing branches correspond to branches 510-514 of FIG. 5, which further correspond to entries 410-414 of FIG. 4.

In block 316, potential sons of the existing branches are determined. Referring to FIG. 5, existing branch 510 includes ten nodes. Excluding the nodes corresponding to bits 5, 8, and 10 (since they have already been used), seven potential sons may be identified for branch 510. Existing branch 511 includes seven nodes. Because none have already been used, seven potential sons may be identified for branch 511. Existing branch 512 includes nine nodes. Excluding the node corresponding to bit 8, eight potential sons may be identified for branch 512. Existing branch 513 includes seven nodes. Because none have already been used, seven potential sons may be identified for branch 513. Existing branch 514 includes four nodes. Because none have already been used, four potential sons may be identified for branch 514.

In block 318, an accumulated score may be calculated for each potential path. According to earlier described embodiments, and the ten example LLR values given previously, accumulated scores for potential sons branching from branches 510-514 may be calculated as follows:

Potential son scores for baseline branch 510:

| 20 | 16 | 12 | 14 | x | 18 | 22 | x | 16 | x |
|---|---|---|---|---|---|---|---|---|---|
| node1 | node2 | node3 | node4 | node5 | node6 | node7 | node8 | node9 | node10. |

Accumulated potential son scores for branch 511 (previous score of 2 added):

| 22 | 18 | 14 | 16 | 12 | 20 | 24 | x | x | x |
|---|---|---|---|---|---|---|---|---|---|
| node1 | node2 | node3 | node4 | node5 | node6 | node7 | node8 | node9 | node10. |

Accumulated potential son scores for branch 512 (previous score of 4 added):

| 24 | 20 | 16 | 18 | 14 | 22 | 26 | x | 20 | x |
|---|---|---|---|---|---|---|---|---|---|
| node1 | node2 | node3 | node4 | node5 | node6 | node7 | node8 | node9 | node10. |

Accumulated potential son scores for branch 513 (previous score of 6 added):

| 26 | 22 | 18 | 20 | 16 | 24 | 28 | x | x | x |
|---|---|---|---|---|---|---|---|---|---|
| node1 | node2 | node3 | node4 | node5 | node6 | node7 | node8 | node9 | node10. |

Accumulated potential son scores for branch 514 (previous score of 10 added):

| 30 | 26 | 22 | 24 | x | x | x | x | x | x |
|---|---|---|---|---|---|---|---|---|---|
| node1 | node2 | node3 | node4 | node5 | node6 | node7 | node8 | node9 | node10. |

In block 320, the next candidate sequence is identified as a sequence corresponding to a potential son with a lowest accumulated score. In the above example, the lowest accumulated score for branches 510-514 is 12, which corresponds to node 5 of branch 511. The next candidate sequence is calculated by flipping the bit, within the sequence corresponding to branch 511, which is associated with the lowest accumulated score, or in this case, flipping bit 5 of the sequence corresponding to path 1, which yields:

Next candidate sequence:

| 0 | 1 | 1 | 0 | 0 | 1 | 1 | 0 | 1 | 1 |
|---|---|---|---|---|---|---|---|---|---|
| bit 1 | bit 2 | bit 3 | bit 4 | bit 5 | bit 6 | bit 7 | bit 8 | bit 9 | bit10. |

The next candidate sequence given above is represented in entry 415 of Table 400 FIG. 4). The path number (field 402) is identified as path 5, the modified bits (field 404) are indicated as bits 5 and 8, the score (field 406) is indicated as 12, and the candidate bit sequence (field 408) is listed as the sequence given above. The next candidate sequence also may be represented in the conceptual tree diagram of FIG. 5. Path 5 includes a portion of branch 510, which occurs to the right of node 8, a portion of branch 511, which occurs to the right of node 5, and the entirety of branch 515, which splits from branch 511 at node 5.

Referring back to FIG. 3, once the next candidate sequence is determined, then the method iterates as shown, by again performing a redundancy check, in block 308, and determining whether the check was successful, in block 310. In this case, the candidate sequence is compliant, and thus is identified as a compliant sequence. Accordingly, the candidate sequence corresponding to path 5 may be considered to be a successfully decoded frame, and the information bits may be delivered to the data recipient, in block 312. The method then ends.

As the above description indicates, the process of determining a next candidate sequence and performing a redundancy check may continue until the candidate sequence is determined to be a compliant sequence. In alternate embodiments, the number of iterations may be limited, and if the limit is exceeded, the decoding process for the block may be declared a failure.

The operations described above, with respect to the methods illustrated and described herein, can be performed in different orders from those disclosed. In various embodiments, a block code may be decoded by a List Viterbi Algorithm (LVA) with the constraint length set to one. Embodiments described above are derived from a new implementation of an LVA, referred to herein as a "tree-search" LVA.

Example embodiments are described above using binary symbols. However, embodiments may be extended to the case of non-binary symbols. In particular, an LVA may work with m-valued symbols. When the constraint length is set to one, an LVA may work on a block code with m-valued symbols, as well. In various embodiments, a "tree-search" LVA may be extended to the case of m-valued symbols. In such embodiments, the number of branches from each node may equal m.

Thus, various embodiments of methods, apparatus, and systems have been described for decoding information. The foregoing description of specific embodiments reveals the general nature of the inventive subject matter sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, the inventive subject matter embraces all such alternatives, modifications, equivalents and variations as fall within the spirit and broad scope of the appended claims.

The various procedures described herein can be implemented in hardware, firmware or software. A software implementation can use microcode, assembly language code, or a higher-level language code. The code may be stored on one or more volatile or non-volatile computer-readable media during execution or at other times. These computer-readable media may include hard disks, removable magnetic disks, removable optical disks, magnetic cassettes, memory cards or sticks, digital video disks, RAMs, ROMs, and the like.

In the foregoing description of various embodiments, reference is made to the accompanying drawings, which form a part hereof and show, by way of illustration, specific embodiments in which the inventive subject matter may be practiced. Various embodiments are described in sufficient detail to enable those skilled in the art to practice the inventive subject matter, and it is to be understood that other embodiments may be utilized, and that process or mechanical changes may be made, without departing from the scope of the inventive subject matter.

Embodiments of the inventive subject matter may be referred to, individually and/or collectively, herein by the term "invention" merely for convenience and without intending to voluntarily limit the scope of this application to any single invention or inventive concept if more than one is, in fact, disclosed. It will be recognized that the methods of various embodiments can be combined in practice, either concurrently or in succession. Various permutations and combinations will be readily apparent to those skilled in the art.

What is claimed is:

1. A method comprising:
performing a redundancy check by a decoding stage of an electronic device to determine if a baseline bit sequence is compliant; and
when the baseline bit sequence is not compliant, performing an iterative process until a compliant, candidate bit sequence is identified, wherein performing the iterative process includes identifying one or more existing branches within a conceptual tree diagram, calculating scores for potential paths branching from the one or more existing branches, and performing a subsequent redundancy check on a next candidate bit sequence, which corresponds to a potential path that has a next lowest score, to determine if the next candidate bit sequence is compliant.

2. The method of claim 1, wherein performing the iterative process comprises using a variation of a Viterbi algorithm.

3. The method of claim 1, wherein identifying the one or more existing branches comprises:
identifying the one or more existing branches within the conceptual tree diagram so that each of the one or more existing branches corresponds to a bit sequence for which a previously-performed redundancy check occurred.

4. The method of claim 1, wherein calculating the scores for the potential paths comprises:
calculating the scores for the potential paths branching from the one or more existing branches so that each score represents an accumulated difference between the baseline bit sequence and a bit sequence for a potential path.

5. The method of claim 1, further comprising:
receiving an information-carrying signal from a channel, wherein the information-carrying signal includes encoded data and redundancy bits;
generating a sequence of soft values from the information-carrying signal; and
performing a basic decoding process on the soft values to generate the baseline bit sequence.

6. The method of claim 5, wherein receiving the information-carrying signal comprises:
receiving the information-carrying signal from a wireless channel, wherein the information-carrying signal includes data encoded using a CS4 encoding scheme of a General Packet Radio System.

7. The method of claim 5, wherein generating a sequence of soft values comprises:
generating a sequence of log likelihood ratio values.

8. The method of claim 1, wherein performing the redundancy check comprises:
performing a cyclic redundancy check.

9. A computer-readable medium having program instructions stored thereon to perform a method, which when executed within an electronic device, result in:
performing a redundancy check to determine if a baseline bit sequence is compliant; and
when the baseline bit sequence is not compliant, performing an iterative process until a compliant, candidate bit sequence is identified, wherein performing the iterative process includes identifying one or more existing branches within a conceptual tree diagram, calculating scores for potential paths branching from the one or more existing branches, and performing a subsequent redundancy check on a next candidate bit sequence, which corresponds to a potential path that has a next lowest score, to determine if the next candidate bit sequence is compliant.

10. The computer-readable medium of claim 9, wherein performing the iterative process comprises using a variation of a Viterbi algorithm.

11. The computer-readable medium of claim 10, wherein identifying the one or more existing branches comprises:
identifying the one or more existing branches within the conceptual tree diagram so that each of the one or more existing branches corresponds to a bit sequence for which a previously-performed redundancy check occurred.

12. The computer-readable medium of claim 10, wherein calculating the scores for the potential paths comprises:
calculating the scores for the potential paths branching from the one or more existing branches so that each score represents an accumulated difference between the baseline bit sequence and a bit sequence for a potential path.

13. The computer-readable medium of claim 9, wherein execution of the method further results in:
receiving an information-carrying signal from a channel, wherein the information-carrying signal includes encoded data and redundancy bits;
generating a sequence of soft values from the information-carrying signal; and
performing a basic decoding process on the soft values to generate the baseline bit sequence.

14. The computer-readable medium of claim 13, wherein generating a sequence of soft values comprises:
generating a sequence of log likelihood ratio values.

15. An apparatus comprising:
a basic decoding stage, adapted to perform a basic decoding process on a sequence of soft values to generate a baseline bit sequence; and
an advanced decoding stage, operatively coupled to the basic decoding stage, wherein the advanced decoding stage is adapted to perform a redundancy check to determine if a baseline bit sequence is compliant, and when the baseline bit sequence is not compliant, to perform an iterative process until a compliant, candidate bit sequence is identified, wherein performing the iterative process includes identifying one or more existing branches within a conceptual tree diagram, calculating scores for potential paths branching from the one or more existing branches, and performing a subsequent redundancy check on a next candidate bit sequence, which corresponds to a potential path that has a next lowest score, to determine if the next candidate bit sequence is compliant.

16. The apparatus of claim 15, further comprising:
a channel equalizer adapted to generate the sequence of soft values, wherein the sequence of soft values includes a sequence of log likelihood ratio values.

17. The apparatus of claim 16, further comprising:
a receiver subsystem adapted to receive an information-carrying signal from a wireless channel, wherein the information-carrying signal includes data encoded using a CS4 encoding scheme of a General Packet Radio System.

18. The apparatus of claim 15, wherein the advanced decoding stage is further adapted to perform the iterative process using a variation of a Viterbi algorithm.

19. The apparatus of claim 15, wherein the advanced decoding stage is further adapted to identify the one or more existing branches by identifying the one or more existing branches within the conceptual tree diagram so that each of the one or more existing branches corresponds to a bit sequence for which a previously-performed redundancy check occurred.

20. The apparatus of claim 15, wherein the advanced decoding stage is further adapted to calculate the scores for the potential paths by calculating the scores for the potential paths branching from the one or more existing branches so that each score represents an accumulated difference between the baseline bit sequence and a bit sequence for a potential path.

21. A system comprising:
a dipole antenna adapted to receive an information-carrying signal from a wireless channel;
a basic decoding stage, adapted to perform a basic decoding process on a sequence of soft values to generate a baseline bit sequence; and
an advanced decoding stage, operatively coupled to the basic decoding stage, wherein the advanced decoding stage is adapted to
perform a redundancy check to determine if a baseline bit sequence is compliant, and
when the baseline bit sequence is not compliant, to perform an iterative process until a compliant, candidate bit sequence is identified, wherein performing the iterative process includes identifying one or more existing branches within a conceptual tree diagram, calculating scores for potential paths branching from the one or more existing branches, and performing a subsequent redundancy check on a next candidate bit sequence, which corresponds to a potential path that has a next lowest score, to determine if the next candidate bit sequence is compliant.

22. The system of claim 21, further comprising:
a channel equalizer adapted to generate the sequence of soft values, wherein the sequence of soft values includes a sequence of log likelihood ratio values.

23. The system of claim 22, further comprising:
a receiver subsystem adapted to receive the information-carrying signal from the dipole antenna, wherein the information-carrying signal includes data encoded using a CS4 encoding scheme of a General Packet Radio System.

24. The system of claim 21, wherein the advanced decoding stage is further adapted to perform the iterative process using a variation of a Viterbi algorithm.

25. The system of claim 21, wherein the advanced decoding stage is further adapted to identify the one or more existing branches by identifying the one or more existing branches within the conceptual tree diagram so that each of the one or more existing branches corresponds to a bit sequence for which a previously-performed redundancy check occurred.

26. The system of claim 21, wherein the advanced decoding stage is further adapted to calculate the scores for the potential paths by calculating the scores for the potential paths branching from the one or more existing branches so that each score represents an accumulated difference between the baseline bit sequence and a bit sequence for a potential path.

* * * * *